United States Patent [19]
Torek et al.

[11] Patent Number: 5,885,903
[45] Date of Patent: Mar. 23, 1999

[54] PROCESS FOR SELECTIVELY ETCHING SILICON NITRIDE IN THE PRESENCE OF SILICON OXIDE

[75] Inventors: Kevin J. Torek; Whonchee Lee, both of Boise, Id.

[73] Assignee: Micron Technology, Inc., Boise, Id.

[21] Appl. No.: 787,205

[22] Filed: Jan. 22, 1997

[51] Int. Cl.⁶ .................................................. H01L 21/302
[52] U.S. Cl. ............................. 438/756; 438/757; 216/99
[58] Field of Search ..................................... 438/756, 757; 216/99

[56] References Cited

U.S. PATENT DOCUMENTS

| | | | |
|---|---|---|---|
| 3,715,249 | 2/1973 | Panousis et al. | 156/17 |
| 3,764,423 | 10/1973 | Hauser, Jr. et al. | 156/3 |
| 4,619,033 | 10/1986 | Jastrzebski | 29/571 |
| 5,286,344 | 2/1994 | Blalock et al. | 156/657 |
| 5,310,457 | 5/1994 | Ziger | 156/657 |
| 5,607,543 | 3/1997 | Eisenberg et al. | 156/662.1 |

OTHER PUBLICATIONS

*Silicon Processing for the VLSI Era*, vol. 1: Process Technology, c. 1986, pp. 533–534.

*Microchip Fabrication*, Second Ed., c. 1997, pp. 226–227.

*Primary Examiner*—Benjamin Utech
*Assistant Examiner*—George Goudreau
*Attorney, Agent, or Firm*—Killworth, Gottman, Hagan & Schaeff, L.L.P.

[57] ABSTRACT

An improved wet etchant process is provided which has greater selectivity than existing hot phosphoric acid etching processes and which maintains a high etch rate in use. The etchant composition includes a second acid having a boiling point higher than that of the phosphoric acid.

10 Claims, No Drawings

PROCESS FOR SELECTIVELY ETCHING SILICON NITRIDE IN THE PRESENCE OF SILICON OXIDE

BACKGROUND OF THE INVENTION

The present invention relates to a process for selectively etching silicon nitride in the presence of silicon oxide, and more particularly to a process for effectively and efficiently etching a layer of silicon nitride at a high etch rate and with high selectivity with respect to exposed or underlying layers of silicon oxide, particularly in a multilayer semiconductor wafer structure.

The manufacture of multilayer semiconductor wafer structures typically involves the deposition of multiple layers of different materials and patterned etching of selected areas of one or more of those layers on a semiconductor surface. Patterned etching can be accomplished using either masking techniques or layers of materials which are relatively unaffected by the chosen etchant. Etching techniques may be broadly categorized as either wet or dry, with wet techniques using solutions of chemicals, typically acids, and dry techniques using, for example, gaseous ionic plasmas.

Conventional wet etching techniques for silicon nitride ($Si_3N_4$) have utilized hot (approximately 145°–180° C.) phosphoric acid ($H_3PO_4$) solutions with water, typically 85% phosphoric acid and 15% water (by volume). As the water vaporizes rapidly at this temperature, the etch is performed in a closed reflux container equipped with a cooled surface to condense the vapors. One problem with hot phosphoric acid etches has been that standard photoresist materials used to mask portions of a surface to be protected from the etchant do not stand up well to the high temperatures and aggressive etch rate (50–100 Å/min.). Consequently, a layer of a silicon oxide, such as silicon dioxide ($SiO_2$), has been used to block the etchant from protected areas on the wafer.

As semiconductor technology has advanced, finer geometry patterns are being used to enable higher density structures to be fabricated. Such finer geometries have created additional problems with hot phosphoric acid etchants for removing silicon nitrides due to insufficient selectivity with respect to silicon oxides. That is, while the hot phosphoric acid etchants will attack silicon nitride and remove it much more rapidly than silicon oxide, the oxide is still attacked as well.

Thus, where a relatively thick layer of silicon nitride must be stripped away in the presence of an area of exposed oxide or a relatively thin layer of an underlying oxide, the potential for there to be a deleterious loss of silicon oxide is significant. Nonuniform layer thicknesses created during deposition steps require that overetching must be employed to ensure complete removal of the nitride.

If an underlying silicon oxide layer is thin and the selectivity of the etchant for nitride over oxide is not sufficiently high, and if the etch must stop in the underlying oxide layer, then overetching of the oxide layer can occur. Additionally, for situations where it is desirable or necessary to maintain as much of the silicon oxide layer as possible, an etchant with a higher selectivity for nitride over oxide than is presently possible with hot phosphoric acid etchants is desirable.

Accordingly, there remains a need in the art for a wet etchant process which effectively and efficiently etches silicon nitride at a high etch rate and with high selectivity with respect to exposed or underlying layers of silicon oxide, particularly in a multilayer semiconductor wafer structure.

SUMMARY OF THE INVENTION

The present invention meets that need by providing an improved wet etchant process which has greater selectivity than existing hot phosphoric acid etchants and which maintains a high etch rate in use. The etchant composition includes a second acid having a boiling point higher than that of the phosphoric acid.

In accordance with one aspect of the present invention, a process for selectively etching silicon nitride in the presence of a silicon oxide is provided and includes the step of contacting the silicon nitride with an etchant solution comprising phosphoric acid, an acid having a boiling point greater than that of the phosphoric acid, and water at a temperature and for a time sufficient to etch the silicon nitride. In a preferred embodiment of the invention, the temperature of the etchant solution is preferably from about 140° C. to about 180° C., and most preferably about 175° C.

A preferred acid having the requisite high boiling point is an inorganic mineral such as sulfuric acid. The etchant solution preferably comprises from about 30% to about 50% by volume phosphoric acid, from about 20% to about 40% by volume sulfuric acid, and the balance water, and most preferably comprises about 42.50% phosphoric acid, about 30.0% sulfuric acid, and about 27.50% water, all percentages by volume.

The process of the present invention effectively and efficiently etches silicon nitride at a high etch rate and with high selectivity with respect to exposed or underlying layers of silicon oxide, particularly in a multilayer semiconductor wafer structure. This and other features and advantages of the present invention will become apparent from the following detailed description and the appended claims.

DETAILED DESCRIPTION OF THE PREFERRED EMBODIMENT

The process of the present invention is directed towards isotropically etching a multilayer structure which includes a silicon nitride layer, although it may find use in any structure where selective etching of a silicon nitride layer in preference to a silicon oxide layer is desired. The process may find particular use in semiconductor fabrication processes in which silicon nitride overlies a relatively thin silicon dioxide layer, and the etch is designed to stop in silicon dioxide. The process is also useful for situations in which a silicon nitride layer is adjacent to an exposed silicon oxide layer. The process of the present invention is also advantageous in that it may be carried out in conventional closed reflux etch baths.

Current hot phosphoric acid etchants used in the art will attack silicon nitride and remove it much more rapidly than silicon oxide. However, the oxide is still attacked as well, and selectivity of the etchant to etch nitride over oxide is only about 30:1 to 45:1. The etching process of the present invention utilizes an additional component—an acid having a boiling point greater than that of phosphoric acid—to increase the boiling point of the etchant solution.

While not wishing to be bound by any specific theory of operation, we have found that if the boiling point of the etchant is increased, the amount of water in the etchant solution at any given temperature may also be increased. This in turn results in an etchant in which selectivity of nitride over oxide is unexpectedly increased to approximately 150:1 or greater. This represent an almost four-fold increase in selectivity over existing hot phosphoric acid etchant processes while maintaining a suitably high nitride etch rate. The present invention thus permits the use of a hot phosphoric acid wet etchant in instances where only a very thin silicon oxide layer is present, such as in advanced semiconductor fabrication technologies.

The process of the present invention includes the step of contacting the silicon nitride with an etchant solution comprising phosphoric acid, an acid having a boiling point greater than that of the phosphoric acid, and water at a temperature and for a time sufficient to etch the silicon nitride. As discussed previously, the presence of a high boiling point acid raises the boiling point of the etchant solution and permits the use of additional water in the etchant solution. In a preferred embodiment of the invention, the temperature of the etchant bath is maintained in a range of preferably from about 140° C. to about 180° C., and most preferably about 175° C.

A preferred acid having the requisite high boiling point is an inorganic mineral such as sulfuric acid. The etchant solution preferably comprises from about 30% to about 50% by volume phosphoric acid, from about 20% to about 40% by volume sulfuric acid, and the balance water, and most preferably comprises about 42.5% phosphoric acid, about 30.0% sulfuric acid, and about 27.5% water, all percentages by volume.

In order that the invention may be more readily understood, reference is made to the following example, which is intended to be illustrative of the invention, but is not intended to be limiting in scope.

EXAMPLE 1

To demonstrate the etching behavior of the etchant process of the present invention, silicon wafers which had silicon nitride and silicon dioxide layers, respectively, deposited on them by a thermal chemical vapor deposition process (CVD) were etched using a heated, closed etchant bath container equipped with a cooled lid to condense vapors. The thickness of the nitride and oxide coatings on the wafers were measured both before and after etching to measure the reduction in thickness of the nitride or oxide layers.

Three liters of an etchant solution was prepared by combining 945 ml of sulfuric acid (95–98% assay), 1500 ml of phosphoric acid (85%) and 555 ml water. The approximate volume percentages were: 30.0% sulfuric acid, 42.5% phosphoric acid, and 27.5% water. This mixture yielded an etchant solution having a boiling point of approximately 175° C.

A silicon wafer with a thermal nitride coating was placed into the etchant solution at a temperature of 152°–153° C. for five minutes. The film thickness on the wafer was measured both before and after etching at five different points. The nitride-coated wafer lost an average of 99 Å in thickness, yielding an etch rate of approximately 20 Å/min.

A silicon wafer with a thermal oxide coating was placed into the etchant solution at a temperature which ranged from 158° C. on immersion to 164° C. at the end of the process for a period of five minutes. The film thickness on the wafer was measured both before and after etching at five different points. The oxide-coated wafer lost an average of 0.5 Å in thickness, yielding an etch rate of approximately 0.1 Å/min.

An additional silicon wafer with a thermal nitride coating was placed into the etchant solution at a temperature which ranged from 170° C. on immersion to 178° C. at the end of the process for a period of five minutes. An additional 50 ml of water was added to the etchant solution during the procedure. The film thickness on the wafer was measured both before and after etching at five different points on the wafer. The nitride-coated wafer lost an average of 257 Å in thickness, yielding an etch rate of approximately 51.4 Å/min.

An additional silicon wafer coated with a thermal oxide was placed into the etchant solution at a temperature of 175° C. for a period of five minutes. An additional 50 ml of water was added to the etchant solution during the procedure. The thickness of the oxide film on the wafer was measured both before and after etching at five different points on the wafer. Within the degree of accuracy of the measurement, the wafer maintained the same thickness, yielding an etch rate of effectively 0 Å/min.

EXAMPLE 2

To compare the selectivity of the etchant process of the present invention, additional coated silicon wafers were etched using the etchant solution of Example 1. A silicon wafer coated with a thermal nitride was placed into the etchant solution at a temperature of 175° C. for five minutes. The thickness of the nitride film was measured both before and after etching at five different points on the wafer. The wafer lost an average of 263 Å in thickness, yielding an etch rate of approximately 52.5 Å/min.

A silicon wafer coated with a thermal oxide was placed into the etchant solution at a temperature of 175° C. for a period of twenty-minutes. In a separate test, an additional silicon wafer with a thermal oxide coating was placed into the etchant solution at the same temperature and for the same twenty minute time period. A longer period of etching was used for the thermal oxide-coated wafers to provide a better measure of the much slower etch rate of the oxide layer.

The thickness of the oxide film on each wafer was measured both before and after etching at five different points on each wafer. The oxide-coated wafers lost an average of 6.5 Å and 3.0 Å in thickness, respectively, yielding an etch rate of approximately 0.325 and 0.15 Å/min, respectively. Selectivity of the rate of nitride etch to the rate of oxide etch was 162:1 and 350:1, respectively, and calculated by taking the ratio of nitride etch rate to oxide etch rate. Such selectivities greatly exceed the 30:1 to 45:1 selectivity of currently-used hot phosphoric acid etchants.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A process for selectively etching silicon nitride to silicon oxide in the presence of a silicon oxide comprising the step of contacting the silicon nitride with an etchant solution comprising from about 30% to about 50% by volume phosphoric, sulfuric acid, and water at a temperature and for a time sufficient to etch said silicon nitride.

2. A process as claimed in claim 1 in which said temperature is from about 140° C. to about 180° C.

3. A process as claimed in claim 1 in which said temperature is about 175° C.

4. A process as claimed in claim 1 in which said sulfuric acid comprises from about 20% to about 40% by volume of said solution.

5. A process as claimed in claim 1 in which said etchant solution comprises about 30% to about 50% by volume phosphoric acid, from about 20% to about 40% by volume sulfuric acid, and the balance water.

6. A process as claimed in claim 1 in which said etchant comprises about 42.5% phosphoric acid, about 30.0% sulfuric acid, and about 27.5% water, all percentages by volume.

7. A process for improving the selectivity of a silicon nitride/silicon oxide etch comprising the step of exposing the silicon nitride to an etchant solution comprising from about 30% to about 50% phosphoric acid, from about 20% to about 40% sulfuric acid, and from about 15% to about 40% water, all percentages by volume, at a temperature and for a time sufficient to etch said silicon nitride without significantly attacking said silicon oxide.

8. A process as claimed in claim 7 in which said temperature is from about 140° C. to about 180° C.

9. A process for selectively etching silicon nitride in the presence of a silicon oxide comprising the step of contacting the silicon nitride with an etchant solution comprising 30% to 50% by volume phosphoric acid, sulfuric acid, and water at a temperature and for a time sufficient to etch said silicon nitride.

10. A process for improving the selectivity of a silicon nitride/silicon oxide etch comprising the step of exposing the silicon nitride to an etchant solution comprising 30% to 50% phosphoric acid, 20% to 40% sulfuric acid, and 15 to 40% water, all percentages by volume, at a temperature and for a time sufficient to etch said silicon nitride without significantly attacking said silicon oxide.

\* \* \* \* \*